United States Patent [19]

Cui et al.

[11] Patent Number: 5,702,629
[45] Date of Patent: Dec. 30, 1997

[54] PIEZOELECTRIC CERAMIC-POLYMER COMPOSITES

[75] Inventors: Changxing Cui, Bethesda; Ray H. Baughman, Morris Plains; Zafar Iqbal, Morristown; Theodore R. Kazmar, Santa Clarita; David K. Dahlstrom, Panorma, all of Calif.

[73] Assignee: AlliedSignal Inc., Morristown, N.J.

[21] Appl. No.: 618,690

[22] Filed: Mar. 21, 1996

[51] Int. Cl.$^6$ .......................... H01L 41/18; H01L 41/157; H01L 41/193

[52] U.S. Cl. .................. 252/62.9 R; 252/62.9 PZ; 524/413; 310/313 R; 310/313 A; 310/311; 310/322; 310/357; 310/359; 310/317; 310/339

[58] Field of Search .................. 252/62.9 R, 62.9 PI; 524/413; 310/313 R, 313 A, 311, 322, 357, 358, 317, 338

[56] References Cited

U.S. PATENT DOCUMENTS

| | | | |
|---|---|---|---|
| 4,128,489 | 12/1978 | Seo | 252/62.9 R |
| 4,675,123 | 6/1987 | Tsunooka et al. | 252/62.9 R |
| 4,826,616 | 5/1989 | Tanino et al. | 252/62.9 R |

*Primary Examiner*—Melissa Bonner
*Attorney, Agent, or Firm*—Verne E. Kreger, Jr.

[57] ABSTRACT

Methods and compositions are described for the preparation of piezoelectric ceramic-polymer composites having improved properties for application in piezoelectric devices. These composites consist of piezoelectric particles embedded in a polymer matrix. The improvements of this invention result from discoveries of the effects of particle size, particle size dispersity, volumetric loading levels, ceramic dielectric constant, and polymer dielectric constant on performance. Various improved devices based on these compositions are also described.

27 Claims, 2 Drawing Sheets

PIEZOELECTRIC CERAMIC-POLYMER COMPOSITES

BACKGROUND OF THE INVENTION

1. Field of the Invention

This invention relates to improved piezoelectric ceramic/polymer composites and to piezoelectric sensors and related devices utilizing such composites.

2. Description of the Prior Art

Piezoelectric materials have been used in a wide variety of sensor and actuator applications. For example, piezoelectric lead zirconate titanate (PZT) and barium titanate (BT) ceramics and piezoelectric polyvinylidene fluoride (PVDF) and poly(vinylidene fluoride-co-trifluoethylene) (PVDF-TrFE) polymers are widely used sensor materials. However, major performance liabilities exist for the application of such piezoelectric ceramics and piezoelectric polymers as sensors. First, although the piezoelectric charge coefficients ($d_{33}$ and $d_{31}$) of PZT and BT are very high (about 100 to 600 pC/N), their hydrostatic charge coefficients ($d_h=d_{33}+d_{31}+d_{32}$) are low because $-(d_{31}+d_{32})$ nearly equals $d_{33}$. Second, since these ceramics have a high dielectric constant (about 1000 to 4000), their piezoelectric voltage coefficients ($g_h = d_h/\epsilon\epsilon_0$, where $\epsilon$ is the dielectric constant relative to the vacuum permittivity $\epsilon_0$) are not high (less than 0.002 mV/N). Third, there is a large difference in acoustic impedance between piezoelectric ceramics and water, and therefore an impedance matching fluid or layer is often needed. Fourth, in order to use piezoelectric ceramics such as PZT or BT for hydrophone applications, mechanical transformer configurations (such as a cylindrical configuration with end caps) are typically utilized in order to increase sensitivity—which increases device manufacture cost. Fifth, the ceramics are very brittle, non-flexible, and non-conformable. Sixth, the high mechanical quality factor of ceramics ($Q_m$) causes ringing within sensors if external damping layers are not used. On the other hand, the piezoelectric voltage coefficients of PVDF and PVDF-TrFE are very high (above 0.1 mV/N). Such piezoelectric polymers are flexible and have an acoustic impedance that differs little from water. Unfortunately, the relatively low dielectric constants of polymers (usually less than 15) can cause sensitivity losses for devices coupled with a voltage amplifier. These sensitivity losses arise because the output impedance of small size, high sensitivity piezoelectric polymer sensors can be comparable to the input impedance of voltage amplifiers. Also, the low piezoelectric charge coefficients of PVDF and PVDF-TrFE (about 20–50 pC/N) make them inferior compared with piezoelectric ceramics when interfaced with a charge amplifier. When the degree of crystallinity of PVDF-TrFE compositions is very high, which is desirable for some applications, these compositions become brittle. Finally, because of high required poling fields, it is difficult to pole piezoelectric polymers when the sensor is thick (above about 0.5 mm).

In order to obtain optimal material properties for sensor applications, piezoelectric ceramic/polymer composites have been extensively investigated. Newnham et al. (Mat. Res. Bull. 13, pp. 525–532, 1978) developed the concept of phase connectivity in order to more effectively design piezoelectric ceramic/polymer composites. While there are many possible phase connectivity patterns, the least expensive composites consist of piezoelectric ceramic particles in a continuous, three-dimensionally connected matrix. If these particles are percolated (so as to form a continuous network) in zero, one, two, or three dimensions, these composites are most rigorously referred to as 0-3 composites, 1-3 composites, 2-3 composites, or 3-3 composites, respectively. However, it is typically difficult to assess the degree of ceramic particle percolation from prior-art reports. Consequently, we will refer to ceramic particle composites in a three-dimensionally connected polymer host as 0-3 composites independent of the degree of percolation of the ceramic particles.

Kyiatama (Rept. Prof. Gr. Inst. Elec. Comm. Egn. Japan., pp. *CPM* 72–17, 1972), Pauer (IEEE Int'l Conv. Rec. pp. 1–5, 1973), and Harrison (Proc. Workshop on Sonar Transducer Mat. Navy Research Lab., pp. 257–268, 1976) made early attempts at fabricating useful 0-3 composites. However, the reported $d_{33}$ values were very low. Yamada et al (J. App. Phys. 53, pp. 4328–4332, 1982) prepared a 0-3 composite from a PZT powder and PVDF. A piezoelectric charge coefficient ($d_{33}$) as high as $48 \times 10^{-13}$ m$^2$/N was obtained, but materials performance for sonar application was not reported. Giniewicz et al. (U.S. Pat. No. 4,624,796) disclosed a 0-3 composite that was prepared from the ceramic powder of a PbTiO$_3$-BiFeO$_3$ (PT-BF) morphotropic solid solution and epoxy. A 60 and 75% volume fraction of the ceramic powder was used. The maximum reported $d_h$ and $d_h g_h$ did not exceed 35 pC/N and $35 \times 10^{-13}$ m$^2$/N, respectively. Also, these inventors did not disclose the dielectric loss of their material, and therefore it is not possible to assess the self-noise that would result for a sensor made from this material. In order to obtain the reported figure of merit, the ceramic powder was prepared by repeated crush-calcination (i.e., mechanical crushing followed by calcination) and water-quenching procedures, which would be costly if used in commercial production. Additionally, the hydrophone performance of the composite at pressures higher than 100 psi was not reported. Although the same inventors (Proc. 1986 IEEE Int'l. Symp. Appl. Ferroelectrics, pp. 285–287, 1986) later claimed that a similar material provided largely pressure-independent performance, the reported figure of merit for this material is relatively low ($d_h g_h = 27 \times 10^{-13}$ m$^2$/N). Banno et al. (Japanese J. App. Phys., 26, pp. 153–155, 1987) prepared piezoelectric flexible composites that are named NTK Piezo-Rubbers PR-303, PR-304, PR-305, PR-306, and PR-307. The compositional details, volume fractions of ceramic powders, and methods of ceramic powder preparation were not disclosed. PR-303, PR-304, and PR-306 show a hydrophone figure of merit ($d_h^2/\epsilon\epsilon_0 = d_h g_h$, where $d_h$ and $g_h$ are the hydrostatic piezoelectric charge and voltage coefficients, respectively) that are in the range from 8 to $12 \times 10^{-13}$ m$^2$/N, while PR-305 and PR-307 have a figure of merit of about $50 \times 10^{-13}$ m$^2$/N. Although PR-305 and PR-307 have a high figure of merit, they are not useful for underwater hydrophone applications because of the dependence of hydrophone performance on hydrostatic pressure and the irreversible damage to the hydrophone caused by high hydrostatic pressures. If another figure of merit (FOM=$d_h g_h$/tan$\delta$) (Bhalla, A. S. and Ting, R. Y. Sensors and Materials, 4, pp. 181–185, 1988) is used, that takes into account dielectric loss (tan$\delta$), a performance problem is evident. This figure of merit is here referred to as the loss-corrected figure of merit. Specifically, PR-305 and PR-307 have dielectric losses of 0.03 and 0.05, respectively, so that $d_h g_h$/tan$\delta$ is $1.7 \times 10^{-10}$ and $1.0 \times 10^{-10}$ m$^2$/N, respectively, which are not very high values for loss-corrected figure of merit. These piezoelectric ceramic/rubber composites have a dielectric constant (about from 34 to 56) that is high compared with ordinary polymers, but much lower than for ceramic ferroelectrics.

Sumita et al. (Makromol. Chem. Rapid Communication, 12, pp. 657–661, 1991) have reported piezoelectric composites of $Pb_{0.93}La_{0.07}(Zr_{0.65}Ti_{0.35})O_3$ (PLZT) and PZT with carbon powders and PVDF for vibration control applications. For a ceramic powder loading level less than 50% by volume, the efficiency of vibration damping is low. However, the observed $d_{33}$ coefficients are 180 and 440 pC/N for the PLZT and PZT composites, respectively. These high piezoelectric charge coefficients can be attributed to the presence of carbon powders that act as conductive media to connect individual ceramic particles isolated in the polymer matrix. The presence of carbon powders also facilitates the poling process of ceramic particles. Unfortunately, because of a high loading level of the carbon powder these materials are too conductive for use in sensor applications. Han et al. ("Effect of Processing Variables on Dielectric and Piezoelectric Properties of 0-3 Composites"; Ph.D. Thesis, Rutgers University, New Brunswick, N.J., 1992) have used a colloidal processing technique to prepare 0-3 composites from ceramic powders of a PT-BF morphotropic solid solution, PZT, and undoped lead titanate (PT) and various polymers. The highest hydrophone figure of merit $(g_h d_h)$ was found for a composite of PT-BF and epoxy to be $56 \times 10^{-13}$ m²/N. However, the loss-corrected figure of merit $g_h d_h / \tan\delta = 1.7 \times 10^{-10}$ m²/N is comparable to that for one of the materials reported by Banno et al. (Japanese. J. App. Phys., 26, pp. 153 1987). The co-precipitation method used to prepare ceramic powders is very tedious and costly. The same is true for the colloidal processing method used for the composite. Additionally, the material with the highest figure of merit has a relatively high dielectric loss of about 0.03. Dias et al. recently reported (Sensors and Actuators A37–38, pp. 343–347, 1993 and Mat. Res. Soc. Symp. Vol. 276, pp. 25–29, 1992) the fabrication of a 0-3 piezoelectric composite from calcium-modified lead titanate (Ca-PT) in a piezoelectric PVDF-TrFE copolymer having a 75/25 mole ratio of vinylidene fluoride to trifluoroethylene. The average particle size of the ceramic powder was 20 μm. The highest figure of merit $(d_h g_h)$ was reported to be $12 \times 10^{-13}$ m²/N, which is much lower than for many previously reported composites. However, because this material has a relatively low dielectric loss of 0.014, the loss-corrected figure of merit $d_h g_h / \tan\delta = 0.9 \times 10^{-10}$ m²/N is almost the same as for the NTK Piezo-Rubber PR-307 that has the highest $d_h g_h$ value.

The prior art does not provide 0-3 composites that are easy processed into sensor configurations, have a high figure of merit $(g_h d_h)$, a low dielectric loss, pressure-independent performance, and a good temperature stability. Newnham et al. (Newnham, R. E. and Markowski, K. A. in Proceedings of the Japan-U.S. Workshop on Functional Fronts in Advanced Ceramics, Tsukuba, Japan, 1995) commented that "It is especially desirable to have the composites prepared without any problems in processing and fabrication and also show high figures of merit for hydrophone applications with little or no variation in static pressure sensitivity under hydrostatic loading". The need for such materials for hydrophone applications is apparent. Improved piezoelectric composites are also required for the host of other applications—such as electromechanical actuators, acoustic projectors, and vibration dampers. Although the prior art does suggest that 0-3 composites might provide promising possibilities for sensor applications and that such composites are potentially better than single-phase piezoelectric ceramics or polymers, the prior art has not shown how to obtain optimal properties from such composites.

SUMMARY OF INVENTION

The invention provides a piezoelectric composite comprising a mixture of piezoelectric ceramic particles in a polymeric material, which polymeric material is continuous in three dimensions, wherein (a) the weight-average diameter D of the piezoelectric ceramic particles ranges from 30 microns to 200 microns, (b) at least 50 weight percent of the piezoelectric ceramic particles have an average diameter that is in the range from 0.5 D to 1.5 D, (c) the dielectric constant of the piezoelectric ceramic particles at one kHz is less than about 700, (d) the dielectric constant of the polymeric material at one kHz is above 2.8, (e) the dielectric loss of the polymeric material at one kHz is less than 0.025, and (f) the volume fraction of the piezoelectric ceramic in the composite is from 40% to 74%.

The invention also provides a process of making a composite comprising forming a mixture of piezoelectric ceramic particles in a polymeric material, which polymeric material is continuous in three dimensions, wherein the particles and polymeric material have the above parameters (a) through (f) above and wherein said piezoelectric ceramic particles are in the form of a free-flowing powder obtained by heating a free-flowing mixture of ceramic-forming metal oxide powders at a temperature of at least about 400° C. for a sufficient time that would sinter a compacted disk of said free-flowing mixture of ceramic-forming metal oxide powders, and wherein said mixture of piezoelectric ceramic powder and polymeric material is melt processed at a pressure of at least 5,000 psi to produce a shaped form.

The invention further provides a process for the preparation of a shaped, piezoelectric composite article comprising (I) dispersing a free-flowing powder of piezoelectric ceramic particles into a solution of a solvent and a polymeric material, (II) forming a composite by steps comprising at least one of (i) and (ii):
(i) adding a non-solvent for the polymeric material to the solvent and separating formed solids from the mixture of said solvent and non-solvent; and
(ii) evaporating the solvent from the solution to form a composite, and (III) pressing the composite into a shaped form at a temperature of above 200° C. and at a pressure of at least about 10,000 psi, wherein the particles and polymeric material have the above parameters (a) through (f).

The invention still further provides a process of poling a composite article having edges, which composite article comprises a mixture of ceramic particles in a polymeric material, which process comprises placing the composite article in an electrical path between a corona discharge and ground so that the edges of said composite are shielded from the corona discharge by an insulating material positioned on the edge of the composite article, wherein a side of said composite article opposite to the corona discharge is contacted with a metallic conductor, the composite article is positioned in a heated bath containing a fluid, the field applied to the composite article from the corona discharge is above about 120 kV/cm, and the temperature of the bath is at least about 30° C. below the highest melting temperature of the polymeric material.

The invention is also directed to a piezoelectric actuator, such as a projector, and to a sensor employing the above composite.

The invention also pertains to a process for forming a composite comprising forming a mixture of piezoelectric ceramic particles in a monomer or prepolymer, followed by reaction of said monomer or prepolymer to produce a polymeric matrix material that is continuous in three dimensions, wherein the particles and polymeric material have the above parameters (a) through (f).

BRIEF DESCRIPTION OF THE DRAWINGS

The invention will be more clearly understood and further applications will be apparent when reference is made to the following detailed description of preferred embodiments of the invention and the accompanying drawings, in which.

DESCRIPTION OF PREFERRED EMBODIMENTS

Figure 1:
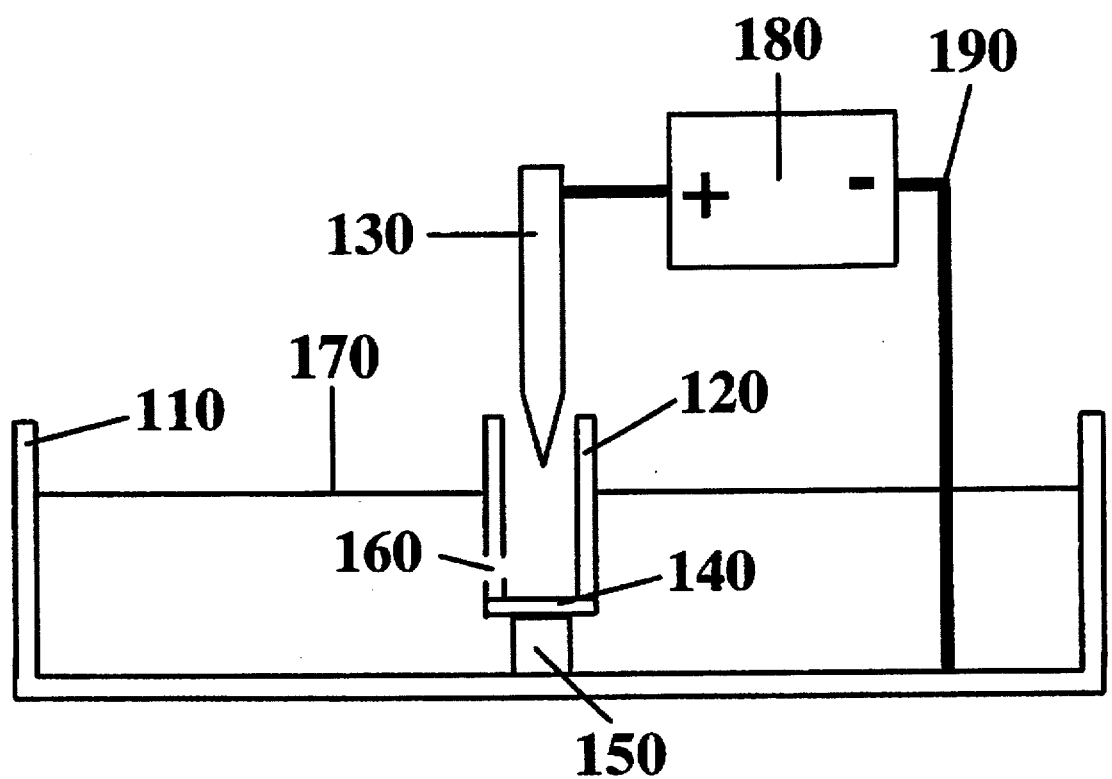
FIG. 1 is a schematic view of an apparatus used for the poling of flat piezoelectric materials.

The present invention provides piezoelectric composites that have high figures of merit, low dielectric loss, pressure independent performance, and convenient processibility into device configurations. Such compositions are of special importance for underwater piezoelectric hydrophone applications. These composites have two components—a first component that is a high dielectric constant, low dielectric loss, and high melting point polymer and a second component that is a piezoelectric ceramic powder. This piezoelectric ceramic powder most preferably consists of spherically shaped Ca-modified lead titanate (Ca-PT), Sm-modified lead titanate (Sm-PT), or lead metaniobate (PN) particles with a uniform or very narrow particle size distribution. The average particle size of the ceramic powder used in the present invention is preferably between 30 and 200 µm and more preferably between 40 and 150 µm. This particle size is preferably smaller than the smallest dimension of the composite or, more preferably, less than about one-tenth of the smallest dimension of the composite. Unless otherwise indicated the term average particle size denotes the weight-average particle size. The terms particle size and particle diameter have the same meaning.

The preferred ceramics used for the powders employed in the present invention embodiments have a dielectric constant at one kHz of less than 700. For reasons of stability with respect to thermal depoling, the Curie transition temperature of especially preferred ceramic compositions is above 200° C.

The performance of the present composite for underwater hydrophone applications is characterized by figures of merit (FOM). When a piezoelectric sensor is interfaced with a voltage amplifier that magnifies the AC voltage generated by the sensor rather than the charge, the most informative and commonly used figure of merit is $$FOM = g_h^2 \epsilon_{33} \epsilon_0 = g_h d_h = d_h^2 / \epsilon_{33} \epsilon_0, \qquad (1)$$

where $\epsilon_{33}$ is the dielectric constant in the poling direction relative to the permittivity $\epsilon_0$ of free space, and $g_h$ and $d_h$ are the piezoelectric voltage and charge coefficients, respectively. The $g_h$ constant determines the sensor voltage per unit thickness that can be generated by a piezoelectric sensor for a pressure change of unity. The $d_h$ constant is a measure of how much change in the charge density per unit area is produced by this pressure change. Note that $g_h$ is relatively temperature insensitive while $d_h$ is temperature sensitive. This is one reason why a voltage amplifier is generally interfaced with piezoelectric sensors for underwater sonar applications. The above figure of merit (1) implies that a useful hydrophone material should have a high $d_h$ constant and a low $\epsilon_{33}$ constant. Unfortunately, most piezoelectric ceramic materials having a high $d_h$ Constant (about 60 pC/N) also have a high $\epsilon_{33}$ constant (about 3500). As a result, their hydrophone figures of merit are low. On the other hand, while piezoelectric polymers have a low dielectric constant they also have a low $d_h$ constant. Again a low figure of merit results. A piezoelectric material having a higher dielectric constant and a higher $d_h$ constant than for polymers is desirable from the viewpoint of maximizing the difference in electrical impedance between the input of voltage amplifiers and the output of the piezoelectric sensors. One of the accomplishments of the present invention is to offer materials that have a high dielectric constant (50–80) and a reasonably high $d_h$ constant (40–60 pC/N), which are translated into a figure of merit $(g_h d_h)$ of about $50 \times 10^{-13}$ $m^2/N$. As shown in this invention, a hydrophone with a high sensitivity is easily fabricated from the present composite materials (See examples).

Other useful figures of merit are $g_h d_h/\tan(\delta)$, $g_h d_h/\rho$, and $g_h d_h/\rho \tan \delta$, where $\tan \delta$ and $\rho$ are the dielectric loss and density of the composite, respectively. The inclusion of $\tan \delta$ into figure of merit takes into account the sensor self-noise and the degree of signal energy loss due to resistive heating. The density $\rho$ in the figure of merit accounts for the acoustic impedance ($Z=c\rho$ where c is the sound velocity and $\rho$ is the density) match between water and hydrophone materials, as well as device weight. The dielectric loss ($\tan \delta$) of the ceramic/polymer composites of the present invention is generally between 0.013 and 0.018. The densities of the present composites are generally between 4 and 5 g/cm³. The loss corrected figure of merit $(g_h d_h/\tan \delta)$ of the present composite materials is about can be above $4 \times 10^{-13}$ $m^2/N$ which is almost twice as high as the highest loss-corrected figure of merit disclosed in the prior art.

Minimization of the sensor material density has two important influences on sensor characteristics. First, a low density material can offer a better match in acoustic impedance between water and sensors. Second, a low density enables the construction of light weight sensors. The prior art teaches that a more than 60% volume fraction of piezoelectric ceramic powders is needed in order to obtain a reasonably high figure of merit. As a result, composites preferred in the prior art have a density of about 5–6 g/cm³. Hossack and Auld (Ferroelectric, 156, pp. 13–18, 1994) state that "A review of successfully manufactured 0-3 composite transducers indicates that a ceramic volume fraction in the range 60% to 65% is required. Devices possessing a ceramic volume fraction below this range do not operate satisfactorily because of the presence of thin insulating films of polymers between the electrically active ceramic particles". The present invention shows that the present composite containing as low as a 50% volume fraction of piezoelectric ceramic powders can offer a figure of merit $(d_h g_h)$ as high as $35 \times 10^{-13}$ $m^2/N$ or a $d_h g_h/\tan \delta$ value of $2.3 \times 10^{-10}$ $m^2/N$. The latter loss-corrected figure of merit is higher than the highest reported prior-art value of $(d_h g_h/\tan \delta = 1.7 \times 10^{-9}$ $m^2/N)$.

It is preferable in the present invention to use high dielectric constant, low dielectric loss, and high melting point polymers to prepare the ceramic/polymer composites. We find that such choice facilitates the poling process and provides a high remanent polarization, low level of self-noise, and a broad operational temperature range. Most high dielectric constant polymers having low dielectric loss are ferroelectrics. Poly(vinylidene fluoride) (PVDF) and poly (vinylidene flouride-co-trifluoroethylene) (PVDF-TrFE)

have a dielectric constant in the range 7 to 15. The poly (acrylonitrile-co-butadiene) rubber (PAB) has a dielectric constant of about 15. PVDF has two major phases. The α-phase material is not piezoelectric and has a dielectric constant of about 10. The β-phase material is piezoelectric and has a dielectric constant in the range 7 to 9. PVDF normally crystallizes in the α phase from its solution in organic solvents or its molten state. The β-phase material is obtained by mechanically deforming the α phase either at room temperature or higher temperatures. Mechanical processing is needed to convert the α-phase PVDF to the piezoelectric β-phase material. However, the PVDF-TrFE copolymer naturally crystallizes in the piezoelectric β phase. Note that the $d_h$ sign of PVDF and PVDF-TrFE is opposite to that of piezoelectric ceramics. If both piezoelectric polymers and ceramic particles in a ceramic/polymer composite are poled in the same direction, their piezoelectric contributions will partially cancel each other. Thus, it is in some cases desirable to use a non-piezoelectric polymer phase having a high dielectric constant and low dielectric loss to prepare 0-3 composites. The α-phase PVDF and PAB rubber are preferred polymer components for the present invention. The α-phase PVDF is more preferred because its melting point is about 170° C., which is far higher than the upper limit (100° C.) on the normally required temperature stability range of underwater sonar sensors. PVDF has a glass transition temperature of −45° C. that is the lower limit of the normally required operational temperature range of underwater sonar sensors. Thus, the composite prepared from PVDF will not be expected to have any phase transitions or structural changes between −45° and 160° C.

Various polymer compositions containing vinylidene fluoride or acrylonitrile monomer units are preferred polymer compositions for the ceramic/polymer composites of this invention. Examples of such preferred compositions are polyvinylidene fluoride, poly(acrylonitrile-co-butadiene) and the various copolymers containing vinylidene fluoride described by Tournet in Macromol. Symp. 82, 99–109 (1994). Especially preferred polymer compositions for the polymer composites of this invention have a melting point above 150° C., as is the case for polyvinylidene fluoride. Since poly(oxymethylene) has a dielectric constant of 3.6–4.0, a low loss tangent of between 0.0015 and 0.005, and a high melting point of about 180° C., this polymer is also especially preferred for the composites of the present invention. Other preferred compositions are nylon 6 (which has a dielectric constant of about 3.5 and a dielectric loss of about 0.01 at one kHz), nylon 66 (which has a dielectric constant of about 3.5 and a dielectric loss of about 0.0125 at one kHz), and nylon 610 (which has a dielectric constant of about 3.2 and a dielectric loss of about 0.015 at one kHz). Even polymers that are of biological origin can be employed either as the entire matrix of the composites of the present invention or a component thereof. Examples are pure cellulose (which has a dielectric constant of about 7.2 and a dielectric loss of about 0.02 at one kHz), cellulose derived polymers, regenerated cellulose (which has a dielectric constant of about 6.7–7.5 and a dielectric loss of about 0.01 at one kHz), and cellophane film (which has a dielectric constant of about 7.5 and a dielectric loss that can be as low as 0.02).

Various epoxies and polyurethanes provide especially preferred compositions for the invention embodiments. Examples are epoxy resins from Conap, Inc. (1405 Buffalo Street, Olean, N.Y. 14760-1139), such as CONACURE® EA-02, EA-028, and EA-117. These compositions have the preferred high dielectric constants (3.5, 4.7, and 4.1, respectively) and low dielectric loss (0.017, 0.001, and 0.008, respectively, where both the dielectric constants and dielectric loss are measured at one kHz). Such epoxy compositions are conveniently commingled with piezoelectric powders and thereafter set at room temperature or higher temperatures to provide the composites of this invention.

Although the prior art has used PVDF as a polymer component in 0-3 composites, it is apparent that the inventors did not realize the importance of the high dielectric constant of this polymer. In a recent report (See Suzuki et al., J. Ceram. Soc. Japan. Int. Ed. 99, pp. 1096–1098, 1993), Suzuki et al commented that "The reason for using the PVDF is that PVDF is relatively stiff elastically". This comment suggests that they are not motivated to use the property of the high dielectric constant of PVDF. Also, relatively poor performance resulted for these prior art composites. On the other hand, the present invention takes full advantages of the high dielectric constant of the polymer component to provide high performance 0-3 piezoelectric composites. A polymer having a dielectric constant (at one kHz) of at least 2.8 is preferred, a polymer having a dielectric constant of at least 5.0 is more preferred, and a polymer having a dielectric constant of above 10 is most preferred. A polymer having a dielectric loss (at one kHz) of less than 0.025 is preferred, a polymer having a dielectric loss of less than 0.02 is more preferred, and a polymer having a dielectric loss of less than 0.01 is most preferred.

The volume fraction of piezoelectric ceramic powders in the piezoelectric ceramic is preferably less than 74% and more preferably less than 60%. Also, the volume fraction of ceramic in the composite is preferably above 40%. More preferably, the volume fraction of ceramic in the composite is between 50 and 60%. The fraction of the free space for an assembly of closely-packed spherical particles is about 26%. When the volume fraction of piezoelectric ceramic powders in 0-3 composites is more than 74%, cavities will be introduced unless there is some polydispersity in particle size. The presence of cavities has several effects. First, cavities will decrease the dielectric constant of 0-3 piezoelectric composites because these cavities are filled with air (that has a low dielectric constant of close to unity). Second, although the presence of voids is known to increase the piezoelectric charge coefficient and figure of merit ($d_h g_h$), such void-space enhanced piezoelectric properties will undesirably depend on hydrostatic pressure. In fact, high hydrostatic pressures can even degrade the performance of void-containing piezoelectric sensors to the point that irreversible damage occurs. Fourth, because the loss of mechanical energy is decreased, the energy conversion efficiency can be increased. Fifth, it may be difficult to pole such composites because they are more susceptible to dielectric breakdown due to the presence of cavities (pores). Therefore, the introduction of cavities in 0-3 composites may increase the figure of merit ($d_h g_h$) of the material, but it also degrades the performance of sensors that must reliably perform under high hydrostatic or non-hydrostatic loading levels, such as found at ocean depths. This limits sensor applications. One of the accomplishments of the present invention is that a high figure of merit is obtained without introducing a porous structure. On the contrary, prior art reports attribute the ability to obtain high figures of merit ($g_h d_h$) to the presence of cavities or pores in the composites (Banno et al., Japanese J. App. Phys. 20, pp. 153–155, 1987). The pore volume in the ceramics of the present art is preferably less than 1.0 volume percent.

We find that the choice of nearly monodispersed ceramic particle distributions is favorable for obtaining ceramic-polymer composites in which the ceramic particles form a continuous network of mechanically touching particles in one, two, or three dimensions. Such continuous networks are called percolated networks. Using mechanical processing steps that do not introduce highly anisotropic strains for the solidified composite, this percolation of the ceramic powder particles is usually in three dimensions. Percolated networks of ceramic powder in one, two, or three dimensions are preferred and percolated networks of ceramic powder in three dimensions are especially preferred. It is preferable if these percolated networks of ceramic particles are obtained for a ceramic loading level of less that 60 volume percentage. The methods of this invention additionally generally provide percolated networks for the polymer component, which is also preferred.

The choice of the particle size of piezoelectric ceramic powders is critical for maximizing the piezoelectric response of 0-3 composites. The prior art (Banno, H. Japanese. J. App. Phys. 32, pp. 4214–4217, 1993 and Giniewicz et al U.S. Pat. No. 4,624,796) suggests that a relatively small particle size (less than 10 μm) be used to prevent the existence of pores in 0-3 composites. Also, the small particle size choice naturally occurs because of the inability to obtain larger ceramic particles from pure PT and PT-BF. This difficulty arises because the large c/a ratio change at the Curie transition temperatures of pure PT and PT-BF fragments crystals. This point is important, since the above two ceramics have been key for prior-art success in the fabrication of 0-3 composites having high figures of merit ($g_h d_h$). In contrast with the small particle sizes used in this prior art work, large ceramic particles with average diameter above 30 μm are preferred for the present work. More preferably, the average particle size is above 40 μm. Most preferably, the average particle size is above 100 μm. These particle sizes are also preferably about one-tenth of the sensor thickness. The use of the powder preparation procedure recommended by this invention provides large ceramic particles and the composite processing method of this invention uses these large size particles to form a non-porous structure. At the same time a high figure of merit is obtained, even though relatively large ceramic particles are used, and the structure is stable to high pressures.

As demonstrated in an example of the present invention, the figure of merit ($d_h g_h$) of 0-3 composites increases from $18 \times 10^{-13}$ m$^2$/N to $35 \times 10^{-13}$ m$^2$/N when the ceramic particle size increases from about 50 μm to about 150 μm at a 50% volume loading level of ceramic powder. The experiment described in the example shows that this surprising result originates since piezoelectric charge coefficient decreases much faster than the dielectric constant decreases as the particle size decreases. Therefore, a 0-3 composite prepared using large, nearly spherical, ceramic particles having nearly uniform dimensions offers the best performance.

Previous investigators have prepared piezoelectric ceramic powders for 0-3 composites using either co-precipitation, repeated crush-calcination, water-quenching, or non-disclosed methods. None of these described methods provides a free-flowing ceramic powder with a uniform or very narrow particle size distribution. In fact, Banno (Japanese J. App. Phys. 26, pp. 153–155, 1987) recommends the use of a powder prepared by mixing differently sized ceramic particles. In contrast with such teachings of the prior art, ceramic powders having a uniform or very narrow particle size distribution are preferred for the present invention. As demonstrated in the examples, the figure of merit ($g_h d_h$) of the ceramic/polymer composites of this invention increases from about $20 \times 10^{-13}$ m$^2$/N to about $50 \times 10^{-13}$ m$^2$/N when a ceramic powder having a narrow particle size distribution is substituted for an otherwise identical ceramic powder having a more polydispersed particle size distribution. One possible explanation for this result is as follows. When a ceramic powder/polymer composite is formed under high pressures from many differently sized ceramic particles, the smaller particles are most likely to reside in cages formed by larger ceramic particles. Stresses applied externally to such a composite will not be efficiently transferred to these smaller particles, because they reside in the cages formed by larger ceramic particles. As a result, the smaller ceramic particles will not make significant contributions to the piezoelectricity of the composite. In fact, such small ceramic particles will dilute the piezoelectric effect originating from the larger ceramic particles. We call this the cage effect. The use of a ceramic powder with a uniform particle size distribution can prevent the cage effect.

For the purposes of this invention, a convenient method for specifying the polydispersity in particle size is to indicate the weight fraction of particles that have a particle diameter that falls in a specified range. The term particle diameter (or particle size) is used for a particle to denote the average diameter of said particle. In preferred invention embodiments at least 50 weight percent of the piezoelectric ceramic particles have a diameter that is in the range from 0.5 D to 1.5 D, where D is the weight-averaged diameter of the ceramic particles. More preferably, at least at 80 weight percent of the piezoelectric ceramic particles have a diameter that is in the range from 0.7 D to 1.3 D, where D is the weight-averaged diameter of the ceramic particles. Additionally, it is preferable that the average diameter of the ceramic particles is between 40 and 150 microns and that the ratio of maximum particle dimension to minimum particle dimension is smaller than 1.3 for at least 50 weight percent of the particles.

Preferred invention embodiments use free-flowing piezoelectric ceramic powders that are prepared by either the spray-drying method or other methods that can offer spherically shaped ceramic particles. These particles can be further classified according to their sizes using either an air-jet separation method or sieves, such as the AS-200 vibratory sieves. Since the particle size preferred in the present invention is larger than 30 μm and the powder is free flowing, the agglomeration problem that occurred during the composite processing in the prior art is eliminated. All void spaces among ceramic particles can be easily filled by polymer if the composite is processed at high temperatures and high pressures. For the purpose of void filling, the temperature of article melt fabrication is preferably substantially above the melting point of the host polymer.

The present invention utilizes piezoelectric ceramics that have a low dielectric constant, a high $d_h$ value, and low dielectric loss. In the preferred embodiment, the ceramic particles have a dielectric loss of less than 0.01. Ca-modified lead titanate (Ca-PT), Sm-modified lead titanate (Sm-PT), lead metaniobate (PN), and mixtures thereof are especially preferred piezoelectric powder compositions for embodiments of this invention. These ceramics have a relatively high $d_h$ value (about 60 to 70 pC/N), a low dielectric loss (<0.005), and a low dielectric constant (about 250). A flee-flowing piezoelectrically-active ceramic powder with a polydispersed particle size distribution can be conveniently prepared by calcinating a green free-flowing ceramic powder made by the spray-drying method. The condition for the calcination of the green ceramic powder is conveniently determined by placing a green disk (made by compaction of this powder) in this free-flowing powder. When this green disk shows the required piezoelectric and dielectric properties, satisfactory sintering within the powder particles is indicated. Additionally, the powder X-ray diffraction method can also be used to determine whether or not the metal oxides in the green powder have fully reacted. As is conventional, green ceramic powder, green ceramic powder, and like terms denote the mixture of materials (generally oxides) that are reacted to form the piezoelectric ceramic.

Typical examples of the ferroelectric ceramics that are useful for the practice of invention embodiments are listed in the following tabulation. The absolute signs of the piezoelectric $d_{33}$ and $d_{31}$ coefficients are sometimes not reliably known:

| Substance | $\epsilon_{33}$ (dielectric constant constant stress) | $d_{33}$ (pC/N) | $d_{31}$ (pC/N) |
|---|---|---|---|
| 78 mole % $BaTiO_3$, 13 mole % $CaTiO_3$, 9 mole % $PbTiO_3$ | 390 | 60 | −20 |
| $K_{0.5}Na_{0.5}NbO_3$ | 290 | 80 | −32 |
|  |  | 160 | −49 |
| $K_{0.1}Na_{0.9}NbO_3$ | 153 |  |  |
| $K_{0.02}Na_{0.98}NbO_3$ | 110 |  |  |
| $NaNbO_3$ | 120 | — | 9 |
| $Na_{0.88}Li_{0.12}NbO_3$ | 220 |  |  |
| $Na_{0.978}Li_{0.13}Nb_{0.888}O_{2.776}$ | 156 |  |  |
| $Na_{0.96}Li_{0.04}NbO_3$ | 200 |  |  |
| $Na_{0.90}Li_{0.10}NbO_3$ | 120 |  |  |
| $Na_{0.98}Li_{0.02}NbO_3$ | 180 |  |  |
| $Na_{0.875}Li_{0.125}NbO_3$ | 108 |  |  |
| $Na_{0.75}Pb_{0.125}NbO_3$ | 320 |  |  |
| $Pb_{0.95}Bi_{0.05}(Ti_{0.975}Zn_{0.025})O_3$ | 147 | 37 | 3.9 |
| $Pb_{0.95}Bi_{0.033}(Ti_{0.95}Zn_{0.017}Nb_{0.033})O_3$ | 203 | 47 | 7.4 |
| $Pb(Ti_{0.8}Cd_{0.089}Nb_{0.044}W_{0.067})O_3$ + 1.5 wt % $MnO_2$ + 2.5 wt % NiO | 190 | 56 | −5.9 |
| $Pb_{0.9625}La_{0.025}(Ti_{0.99}Mn_{0.01})O_3$ | 170 | 51 | −4.4 |
| $Pb(Ti_{0.95}Zn_{0.017}Nb_{0.033})O_3$ | 226 | 47 | 7.0 |
| $Pb(Ti_{0.606}Zr_{0.394})O_3$ | 416 | 110 | −43 |
| $Pb(Ti_{0.526}Zr_{0.48})O_3$ | 666 | 223 | −93.5 |
| $Pb_{0.945}Bi_{0.01}(Ti_{0.085}Zr_{0.915})O_3$ | 240 | 95 |  |
| $Pb_{0.95}Mg_{0.05}(Ti_{0.54}Zr_{0.43}Cr_{0.03})O_{2.085}$ | 460 | 71 | −27 |
| $Pb_{0.945}La_{0.01}(Ti_{0.085}Zr_{0.915})O_3$ | 220 | 95 |  |
| $Pb_{0.988}(Ti_{0.42}Zr_{0.58})Nb_{0.024}O_3$ | 630 |  | 75 |
| $Pb_{0.995}(Ti_{0.074}Zr_{0.916}Sb_{0.010})O_3$ | 250 | 104 |  |
| $Pb(Ti_{0.47}Zr_{0.53})O_3$ + 2 mol % ZnO | 570 |  | 67 |
| $Na_{0.5}Bi_{0.5}TiO_3$ | 300 | 70 | 15 |

Another useful ceramic material is $[Pb_xSm_y](Ti_zMn_{1-z})O_3$ wherein x is about 0.85, y is about 0.10 and z is about 0.98.

Certain ceramic compositions from this list that are preferred for embodiments of the present invention can be described by the formula $M_tM'_{1-t}NbO_3$, wherein M and M' are chosen from Na, Li, and K and t is less than unity. Other ceramic compositions from this list that are preferred for embodiments of the present invention can be described by the formula $Pb_xQ''_v(Ti_yQ_zQ'_u)O_3$, wherein M and M' are selected from Zn, Nb, Zr, Sb, and Mn, M" is selected from Bi, La, and Nb, both x+v and y+z+u are about 1, and v is no more than about 0.05. Additional ceramic compositions from this list that are preferred for embodiments of the present invention are $Na_{0.5}Bi_{0.5}TiO_3$ and $Na_{0.75}Pb_{0.125}NBO_3$.

For use in hydrostatic pressure sensors, it is preferable that the piezoelectric ceramic used for the composites of this invention have a ratio of $-d_{33}$ to $(d_{31}+d_{32})$ that exceeds 5. More preferably, this ratio exceeds 10 and the dielectric constant of this ceramic is less than 200 at one kHz.

In contrast with the above, prior-art investigators have generally employed ceramic powders of either pure lead titanate (PT) or a PT-BF morphotropic solid solution. One problem here is that the reproducibility of the dielectric and piezoelectric properties of pure PT is not good (Jaffe, B., Cook, W. R., and Jaffe, H. "Piezoelectric Ceramics", Academic Press, New York, 1971). Although high quality undoped PT is commercially available, Monroe et al. (Ferroelectric Lett, 5, pp. 39–46, 1986) have found that polymer composites of this ceramic do not provide attractive piezoelectric properties. Some inventors (Han, K., "Effect of Processing Variables on Dielectric and Piezoelectric Properties of 0-3 Composites" Ph.D. Thesis, Rutgers University, New Brunswick, N.J., 1992) concluded that a tedious and costly co-precipitation method should be used for the ceramic powder preparation. The prior art (Giniewicz et al U.S. Pat. No. 4,624,796) also shows that when the PT-BF ceramic is used to prepare powders, a repeated crush-calcination and water quenching procedure should be used in order to obtain a reasonably high hydrophone figure of merit. There are other problems related to undoped PT and PT-BF powders used in the prior art. It is very difficult to prepare powders of these ceramic having a particle size larger than 10 μm. This problem arises because a large c/a ratio change occurs at the Curie transition temperatures during cooling. This large c/a ratio change tends to either break the ceramic into very fine particles or introduce microcracks that are not be easily detected. The above problems do not exist for the specially preferred compositions of the present invention. The particle size can be prepared as large as the application demands.

The importance of using a low dielectric constant piezoelectric ceramic in the polymer/ceramic composites of this invention is herein demonstrated. A 0-3 composite comprised of a PZT powder and PVDF at a 65% volume loading level of the ceramic powder shows a $d_{33}$ value less than 70 pC/N. Considering that the corresponding ceramic rod has a $d_{33}$ constant of 610 pC/N, this value of $d_{33}$ is extremely low (only 11% of that of the pure ceramic). For comparison, a Ca-PT and PVDF 0-3 composite containing a 65% volume of the Ca-PT ceramic powder was made using the same method as employed for the PZT/PVDF composite. The measured $d_{33}$ constant for this composite was 64 pC/N, which is 78 % of that for the pure Ca-PT ceramic (which has a $d_{33}$ constant of 82 pC/N). The reason why the 0-3 PZT-PVDF composite shows such a small fraction of the $d_{33}$ coefficient of the PZT likely originates from the large difference in dielectric constant between PZT (about a dielectric constant of 3500 for the present PZT) and PVDF. As a result, the PZT particles in the 0-3 composite can not be fully poled because the field ($E_c$) acting on the ceramic particle is approximately related to the applied field ($E_0$) by $E_c = 3E_0\epsilon_p/(2\epsilon_p + \epsilon_c)$, where $\epsilon_p$ and $\epsilon_c$ are the dielectric constants of the polymer and ceramic, respectively. Thus, $E_c \approx 0.001 E_0$. Hence, the largest value of applied field $E_0$ that can be applied across the ceramic without causing breakdown is not sufficient to pole the ceramic. On the other hand, there is another important factor to consider. Even if the PZT particles in 0-3 composites could be fully poled, this composite would still not provide large retention of the piezoelectric properties of the ceramic powder. This is because the remanent polarization ($P_p$) of the composite is approximately related to the remanent polarization ($P_c$) of the PZT particles by $P_p = 3v_cP_c\epsilon_p/(2\epsilon_p + \epsilon_c)$, where $v_c$ is the volume fraction of the PZT powder in the 0-3 composite. The above surprising results, and the theoretical arguments to support these results, provides the basis for the use of low dielectric constant ceramics and high dielectric constant polymers in the present invention. Note that "low dielectric constant" and "high dielectric constant" are relative terms that pertain to the range of dielectric constants that are encountered for a particular class of materials (ceramics on the one hand and organic polymers on the other). Hence a low dielectric constant ceramic will generally have a higher dielectric constant than does a high dielectric constant organic polymer. Unless otherwise mentioned, dielectric constant and dielectric loss designate the values of these parameters measured at room temperature and a frequency of one kHz.

A variety of shapes of ceramic particles have been incorporated in various piezoelectric composite. Non-spherical shapes, such as fiber-like PZT particles, have been used by Safari (J. Phys. III France, 4, pp. 1129–1149, 1994) for the fabrication of piezoelectric composites. Very promising results were obtained. However, the fabrication of these non-spherically shaped ceramic particles can be costly. In contrast, spherically shaped ceramic particles are preferred for the present invention. Because the piezoelectric charge coefficient of the present composite is comparable to the product of the ceramic volume fraction and the piezoelectric charge coefficient of the pure ceramic, the use of ceramic particles having a substantially non-spherical shape is not expected to provide improved performance.

Various methods can be used for the compounding and fabrication of the piezoelectric composites of the present invention. For example, PVDF can be compounded with a free-flowing piezoelectric ceramic powder via either (1) melt-phase dispersion, (2) solution-phase dispersion, or (3) dispersion in a colloidal polymer suspension. Various solvents can be used for an initial step of dispersing the ceramic powder in a solution of PVDF. Examples of suitable solvents are ethylene carbonate, cyclohexanone, γ-butyrolactone, N,N-dimethylacetamide, N-methylpyrrolidone, and dimethyl sulfoxide. Films of the piezoelectric composite can be formed by solvent evaporation. Alternately, such films can be obtained by first adding a non-solvent to a solution containing a mixture of dispersed ceramic particles and dissolved PVDF, and then separating the sample by filtration. The resulting sample can then be dried and hot-pressed to form the desired piezoelectric film. Examples of such non-solvents suitable for PVDF are alcohols, methylisobutyl ketone, aliphatic hydrocarbons, and cycloaliphatic hydrocarbons.

In addition to the above methods for forming a ceramic/polymer composite of this invention, such composites can be formed by dispersion of the ceramic powder in either a prepolymer or monomer for the piezoelectric polymer, and then providing the final matrix polymer composition by reaction of the prepolymer or polymer. For example, this reaction can be conveniently accomplished by thermal processes or the effects of actinic radiation, such as ultraviolet, electron-beam, or γ-ray radiation. Epoxy compositions that are obtained by thermal reaction, especially reactions at close to room temperature, are preferred compositions for use in such methods of forming the composites of the present invention.

Melt-phase fabrication is especially preferred for the composites of the present invention. Examples of useful melt-phase fabrication methods are hot-rolling, hot-pressing, extrusion, flat pressing, and injection molding. For the fabrication of more complex sensor shapes such as cylinders, injection molding and extrusion are especially preferred. In order to avoid the formation of a porous structure, vacuum may be applied during the forming step for a piezoelectric composite articles. If a hot-pressing method is used, the stress used for compaction is preferably as high as can be conveniently applied without fracturing the ceramic particles. The preferred temperature for melt processing is at least 5° C. above the melting point of the polymer matrix. More preferably, the temperature for melt processing is at least 30° C. above the melting point of the polymer matrix. If the host polymer is a mixture of different polymers having different melting points, the preferred melt processing temperature is at least 5° C. above the highest melting point component of the polymer mixture and more preferably at least 30° C. above the highest melting point component of the polymer mixture. The pressure applied during processing is at least 2000 psi, and more preferably at least 10,000 psi, and most preferably at least 30,000 psi. Such high pressure will effectively remove cavities in the composite, which is necessary in order to ensure that the hydrophones provide pressure independent performance.

Various poling methods are applicable for the composites of the present invention. These include DC poling, corona poling, plasma poling, pulse poling, and poling under more complicated voltage conditions (which can involve various combinations of DC, AC, pulse, and corona poling) at either a single temperature or a range of temperatures. One preferred method of poling is DC poling in a thermostatically temperature-controlled silicon oil bath, which is the method frequently used by investigators of piezoelectric materials. In order to ensure most complete and rapid poling, the maximum poling field should be preferably as high a field as can be applied without causing dielectric breakdown of the composite. The maximum applied poling fields for the present composite are preferably above 120 kV/cm. Preferred poling temperatures are at least 10° C. below the highest polymer matrix melting temperature and more preferably at least 30° C. below the highest matrix melting temperature. There are two purposes of using high poling temperatures. First, high temperatures decrease the coercive field of the ceramic component. Second, high temperatures can increase the dielectric constant of the polymer component, so that the difference in dielectric constant between the ceramic and polymer decreases. In order to apply a high poling field, the poling field should be increased progressively from a low field that is far from the breakdown field to a field that is slightly less than the breakdown field.

A possible disadvantage of the DC poling method is that the local breakdown can short circuit the poling electrodes—thereby prevent further poling. Another preferred method is corona poling or plasma poling, which is less susceptible to short circuit effects and is well suited for the poling of large area films in a continuous commercial process. Corona poling of plate-like composite articles is preferably carried out in a silicon oil bath as illustrated in FIG. 1. The power supply 180 is connected by the wires 190 to ground and to a tip 130 used for corona discharge. The sample 140 sits on a metal rod 150 in a heated oil bath pan 110 that contains oil having surface 170. The insulating Teflon tube 120, which contains the hole 160 that enables liquid flow, shields the edges of the sample disk 140 from the effect of field-associated breakdown. Use of this method increases the dielectric breakdown voltage from the edge of the sample to the ground. As a result, a much high voltage can be applied as compared with that for a normal corona poling process in air, which is an aspect that is described in a prior art report (Waller et al., J. Am. Ceram. Soc., 72, pp. 322–324, 1989). If samples are electroded, the same apparatus can still be used.

Figure 2:
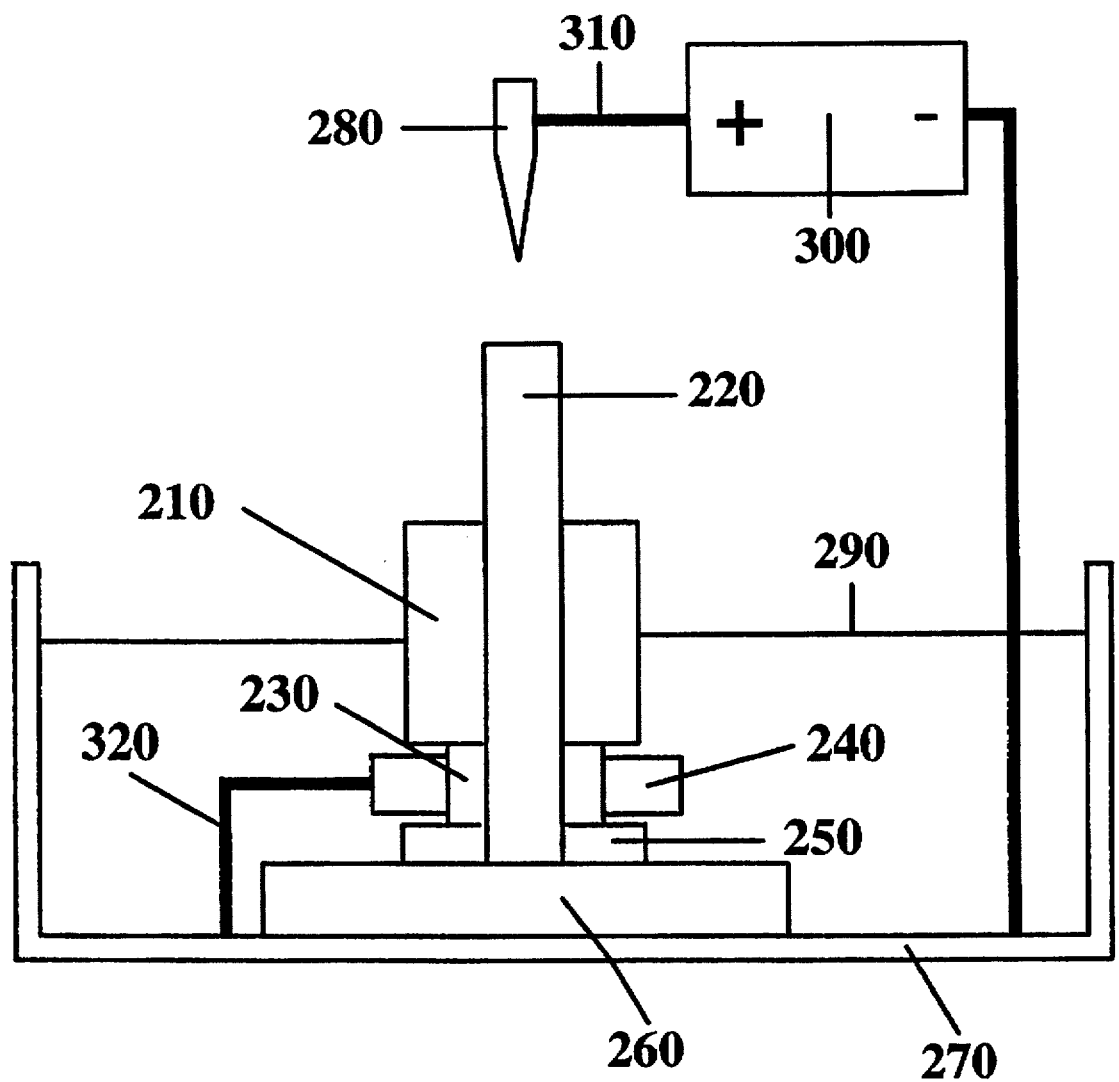
FIG. 2 is a schematic view of an apparatus used for the poling of cylindrical piezoelectric materials.

A modification of the corona poling setup in FIG. 1 can be used to pole cylindrically shaped composite articles. This method is illustrated in FIG. 2. The power supply 300 is connected by the wires 310 to ground and to a tip 280 used for corona discharge. The cylindrical composite sample 230 is in a Teflon cylinder ring 250 that rests on a Teflon plate 260 in a heated metal oil bath pan 270 that contains a volume of oil having a surface 290. The cylindrical Teflon tube 210 and the cylindrical Teflon ring 250 shield the edges of the sample cylinder 230 from the effect of field-associated breakdown. The metal rod 220, which passes through the centers of the parts 210, 230, 240, and 250, brings the corona discharge current to the sample. The cylindrical metal ring 240, which is connected to the metal oil bath pan by grounding wire 320, serves as an electrode for the poling process. A metal rod 220 is inserted into a cylindrical composite sample 230 and serves as the second electrode. The advantage of this modified corona poling method is that the poling temperature can be easily controlled and high voltages can be applied without causing breakdown.

The poling of cylindrically shaped articles across the cylinder wall is very different from the poling of either disks or plates. When a voltage (V) is applied to a plate with a thickness of t, the electric field strength will be V/t. Hence, the electric field is uniform across the thickness. This is not true for poling cylinders in the thickness direction. If a and b are the inner and outer diameters of the cylinder, respectively, and a<r<b, the electric field strength across the cylinder wall follows the relationship $E(r)=(V/r)\ln(a/b)$. Hence, the inner surface of the cylinder experiences a much higher electric field than the outer surface. As a result, the inner part of the cylinder may already electrically break down when the outer part of the cylinder is not yet fully poled. In general, a cylinder can not be poled as fully as a disk or plate. Thus, figures of merit for hydrophone sensors depend on the sensor configuration.

Poling provides special challenges for 0-3 ceramic polymer composites in which ceramic particles do not form a continuously connected structure across the inter-electrode dimension. Prior art reports (J. Mat. Sci. Lett. 12, pp. 1182–1184, 1992, U.S. Pat. No. 4,944,891, and U.S. Pat. No. 5,043,622) suggest the use of conductivity enhancement additives such as carbon and semiconductor powders to facilitate the poling of 0-3 composites. Unfortunately, the introduction of such additives into 0-3 piezoelectric composites results in a high dielectric loss. Consequently, the resultant composites are often too conductive to be used for sensor applications. One of the accomplishments of this invention is that a high degree of poling can be achieved without using any conductive enhancement additives. For example, one of the present composites containing a 65% volume fraction of 150 μm sized Ca-PT ceramic particles shows a $d_{33}$ value of 64 pC/N, which nearly equals that of a fully poled Ca-PT disk that contains no polymer (which has a $d_{33}$ value of 82 pC/N). Hence, conductivity enhancement additives need not be used to obtain high performance for the sensors made using the present invention embodiments.

Electrodes are required on the composite devices both for most sensor applications and for many poling methods. Such electrodes can be conveniently attached to the sample by a number of well-established methods. The most effective method is to sputter a metal coating on the composite, such as silver, gold, or aluminum. When this method is used, the temperature of samples will increase during the sputtering process, which might depole samples. Therefore, prior art methods generally sputter deposit electrodes before poling. On the contrary, in present invention embodiments it is possible to attach electrodes after corona or DC poling. This post-poling attachment of electrodes is possible without causing sample depoling due to the very high thermal stability obtained for the 0-3 composites of the present invention. For example, if PVDF is used as the host polymer, we find that the piezoelectric composites do not noticeably decay in performance after months at 100° C. The sputter deposition of electrodes is expensive and difficult to use for complicated configurations such as cylinders. The deposition of electrodes using conductive inks is generally preferred for invention embodiments. Silver ink, such as made commercially by Creative Materials, is preferably used for electrode attachment. This electrode attachment can be conveniently accomplished by applying the ink to the shaped piezoelectric composite by brushing or dipping, followed by thermal curing. This type of silver inks requires relatively high curing temperatures in the range 80° to 180° C. This does not pose any problems for the composites of the present invention because of their high temperature stability. Since the silver ink is a low viscosity liquid, articles having complicated shapes can be dipped into the liquid and then cured. This dip-coating process is especially useful when a cylindrically configured sensor must be electroded. In such process, regions of the sample that should not be electrode coated are easily protected during the dipping process, such as by using adhesive tape that is later removed. Alternately, the entire article can be dip-coated and unwanted depositions can be thereafter removed, such as by scraping or sanding.

The sensor thickness has major effects on sensor design and manufacturing. When charges produced by a piezoelectric sensor are used to directly provide the sensor signal, a charge amplifier will be interfaced with the sensor. Piezoelectric accelerometers generally use charge amplifiers. In such case the thickness and capacitance of the sensor element is not crucial. On the contrary, when the AC voltage generated by a piezoelectric sensor is used as the detected signal, the thickness and capacitance of the sensor element are critical for the following two reasons. First, the voltage (V) produced by a piezoelectric sensor under hydrostatic pressure (P) is $V=tg_hP$, where t is the sensor thickness. Hence, the thicker the sensor the more sensitive the sensor. Second, the electrical output impedance of the sensor should be designed to be much lower than the input impedance of voltage amplifiers. This can be accomplished by maximizing the sensor capacitance through minimizing the sensor thickness and maximizing the dielectric constant. Unfortunately, the minimization of the sensor thickness and maximization of dielectric constant to lower the output impedance of the sensor conflicts with the maximization of the sensor thickness and the minimization of the dielectric constant to increase sensor sensitivity. Consequently, an intermediate sensor thickness is chosen that will meet both sensitivity and capacitance performance targets. This invention is useful for producing shaped articles having a thickness greater than or equal to 1 mm.

The underwater hydrophone sensitivity (S in dB with respect to 1 V/μPa) in free field is defined as $$S=20 \log (tg_h/10^6), \qquad (2)$$

where $tg_h$ is in units of volts per Pa. In order to obtain a high sensitivity a sensor should be as thick as possible and $g_h$ should be as high as possible. However, the $g_h$ value depends on how well a sensor is poled. In turn, the degree of poling depends upon how high an electric field can be applied during poling, without causing dielectric breakdown. It is well known that the dielectric strength of matter depends on thickness. Gerson and Marshall (J. App. Phys. 30, pp. 1650–1653, 1959) found for piezoelectric ceramics that the breakdown field ($E_b$ in kV/cm) is related to the thickness (t in cm) by the following relationship:

$$E_b = 27.2 t^{-0.39}. \tag{3}$$

Note that if the thickness of samples is increased by a factor of 2, the breakdown voltage is not increased by a factor of 2, but instead by a factor of about 1.53. This is because the probability of the occurrence of breakdown-causing defects in the sample volume increases with the increase in the sample thickness. Thus, the thicker the sample, the lower the breakdown field. As a result, a lower $g_h$ value is expected for a thicker sample, if we are in the limit where dielectric breakdown limits the degree of possible poling. A similar relationship should be valid for 0-3 piezoelectric composites, although such a relationship has not been established quantitatively. Consequently, the need to increase $g_h$ by increasing the degree of poling conflicts with the need to increase the sensor sensitivity by increasing the sensor thickness. Consequently, the measured figure of merit has a close relationship with the sample thickness.

Most prior art researchers have reported figures of merit for samples having a thickness less than 1 mm. For example, see Han, K. in "Effect of Processing Variables on Dielectric and Piezoelectric Properties of 0-3 Composites"; Ph.D. Thesis, Rutgers University, New Brunswick, N.J., 1992; Dias et al. in Sensors and Actuators A37-38, pp.343-347 (1993) and Mat. Res. Soc. Symp. Vol. 276, pp.25-29, (1992); Sagong et al. in U.S. Pat. No. 4,944,891; and Safari et al., in Am. Ceram Soc. Bull., 66, 668-670, 1987). Banno et al. (Japanese J. App. Phys., 26, pp. 153, 1987) obtained respectable figures of merit ($d_h g_h \sim 50 \times 10^{-13}$ m²/N) for samples with a thickness of 3 mm. However, the performance of these materials is irreversibly degraded by hydrostatic pressure loading and the materials provided undesirably high dielectric loss (about 3 to 5%). The composites of the present invention are easy to process and can offer sensors with a figure of merit ($g_h d_h$) between 35 and $50 \times 10^{-13}$ m²/N at a thickness of about 2 mm. The sensors of the present invention also show a pressure independent performance. A free-field hydrophone sensitivity of better than −200 dB (re 1 V/μpa) can be easily obtained using the composites and methods of this invention and either disk or cylinder sensor configurations.

The test of the temperature stability of the present sensors shows that they are stable for months at 100° C. This result is reasonable since the aging properties of the present composite sensor should follow that of the Ca-PT ceramic. This is because the present polymer components do not make any important direct contributions to piezoelectricity. For example, the PVDF in the present composites is probably neither in the piezoelectric phase nor significantly poled. Also, the PVDF has a glass transition temperature of −43° C. and a melting point of 170° C. Hence, the PVDF does not have any special structure changes between −40° and 160° C. that would adversely effect performance. These exceptional stabilities for the piezoelectric ceramic/polymer composites are in dramatic contrast with the high temperature instabilities for the piezoelectric polymer sensors of the prior art.

Benefits provided by the compositions and processing methods, as compared to prior art compositions and processing methods, are increased figure of merit, increased dielectric constant, decreased dielectric loss, decreased density, increased temperature stability, easy fabrication and processing, pressure independent performance, and highly reproducible performance. The present invention utilizes the high dielectric constants of PVDF and PAB both to facilitate the composite poling process and to increase the remanent polarization of the composites. This leads not only to a higher piezoelectric charge coefficient for the composite, but also to the elimination of the use of conductivity enhancement additives that are often necessary in the prior art for the purpose of achieving poling. Hence, the performance degradation caused by dielectric loss introduced by these additives can be avoided.

The ceramic powders used in the invention embodiments preferably have a narrow or uniform particle size distribution. We find that the absence of substantial particle size dispersion facilitates the efficient transfer of stresses from the overall composite to the individual ceramic particles. In fact, the examples of this invention show that the hydrostatic figure of merit is nearly doubled when the particle size dispersity is substantially decreased for a particular ceramic powder.

As opposed to claims in prior-art technology that the average particle size of the ceramic powders should be on the order of several microns and no more than ten microns, the average particle size for the present invention is preferably above 30 microns and more preferably between 40 and 150 microns. As demonstrated in this invention, the figure of merit for a composite prepared from 150 micron average diameter ceramic powder is almost twice as high as that from a 50 micron average diameter ceramic powder at the same 50% volume loading level of the ceramic powder.

Hossack and Auld have stated in a recent article on piezoelectric composite sensors (Ferroelectrics 156, pp. 13-18 (1994)) that "A review of successfully manufactured 0:3 transducers indicates that a ceramic fraction in the range from 60% to 65% is required. Devices possessing a ceramic volume fraction below this range do not operate satisfactorily because of the presence of thin insulating films of polymer between the electrically active ceramic particles." In contrast to such prior art claims that a ceramic powder loading level of at least 60 volume percent is needed in a composite in order to obtain satisfactory performance, the present invention shows that a hydrophone figure of merit ($d_h g_h$) as high as $35 \times 10^{-13}$ m²/N ($d_h g_h / \tan\delta = 2.3 \times 10^{-10}$ m²/N) can be achieved for a composite containing a 50 volume percent loading of ceramic powder. At a ceramic powder loading level of 65% by volume, $d_h g_h$ and $d_h g_h / \tan\delta$ are about $50 \times 10^{-13}$ and $3.3 \times 10^{-10}$ m²/N, respectively. The latter figure of merit is almost twice as high as the highest figure of merit of prior art technologies. Also, the preferred high pressure and high temperature processing of 0-3 composites of this invention provides hydrophones whose performance is independent of hydrostatic pressure loading up to at least several thousand psi.

While the most preferred applications of the piezoelectric composite compositions of this invention are for sensors, these compositions can also be advantageously employed for actuators, such as acoustic projectors. Advantages of these composite compositions compared with piezoelectric polymers for actuator applications is their high thermal stability and high d coefficients. Since the d coefficients indicate the amount of strain produced by a given change in the applied electric field, a high value for a d coefficient is highly desirable for providing a large actuator displacement. While ceramics can have d coefficients that are much larger than for the ceramic composites of this invention, such ceramic composites have an important disadvantage compared with the present ceramic/polymer composites. This disadvantage for the acoustic projector category of actuator applications is the significantly higher density of the pure ceramics compared with the ceramic/polymer composites. As a result of the lower densities of the ceramic/polymer composites of this invention, they more efficiently couple to water for marine and medical acoustic projector applications. Examples of actuator applications and device configurations (such as for acoustic projectors) that are suitable for the composites of the present invention are found in the book entitled "The Application of Ferroelectric Polymers" (T. T. Wang, J. M. Herbert, and A. M. Glass Editors, Chapman and Hill, N.Y., 1988) and U.S. Pat. No. 5,276,657. All of the foregoing patents and publications are incorporated herein by reference.

The following specific examples are presented to more particularly illustrate the invention, and should not be construed as being limitations on the scope of the invention.

EXAMPLE 1

This example describes the preparation of piezoelectrically active ceramic powders that are used for this invention. Green, free-flowing ceramic powder (containing an organic binder) having the ceramic composition $(Pb_{0.76}Ca_{0.24})$ $((Co_{1/2}W_{1/2})_{0.04}Ti_{0.96})O_3$ was purchased from EDO Acoustics. This sample is called EC-97. Substantially identical results were also obtained using the corresponding green ceramic that we prepared according to the literature method, and then spray-dried into a free-flowing powder form using a Buchi mini-spray dryer (Yamashita, Y., Yokoyama, K., Honda, H., and Takahashi, T. Japanese J. App. Phys., Supplement 20-4, pp. 183–187, 1981). The free-flowing, green ceramic powder was placed in a Coors alumina crucible together with a green disk that was used for test purposes. This test disk was prepared by compaction of this green ceramic powder, and had a diameter of 13 mm and a thickness of 1.0 mm. The sample-containing crucible was heated in a Thermolyne F47955 furnace for the following temperature-time program:

(1) from 25° C. to 600° C. at a heating rate of 5° C./min, (2) 12 h at 600° C., (3) from 600° C. to 1100° C. at a heating rate of 5° C./min, (4) 3 hours at 1100° C., and (5) from 1100° C. to room temperature without temperature control. After cooling to room temperature, the obtained dark-brown powder was shaken in a plastic bottle until it became free-flowing After sintering, the test disk had a diameter of about 11 mm and a thickness of about 0.75 mm. After electroding both sides with silver ink (from Creative Materials), this disk was poled at 120° C. under a DC field of 8 kV for 30 minutes using the apparatus in FIG. 1. The distance between the needle and the disk was about 2 cm. A week after poling, the disk showed a $d_{33}$ value of 82 pC/N at 100 Hz (Berlincourt $d_{33}$ meter), a dielectric constant of 270, and a dielectric loss of 0.005 at one kHz (HP 4261A LRC meter). These measured properties are close to literature values for the highly poled ceramic. The somewhat higher $d_{33}$ coefficient observed here (compared to the literature value of 68 pC/N) is believed to be a result of the use of a lower measurement frequency in the present work. X-ray diffraction analysis of the fired ceramic powder (using a Philips PW-1470 diffractometer with a Cu Kα source in the parafocus mode) showed the impurity-free diffraction pattern expected for the tetragonal perovskite structure.

EXAMPLE 2

This example describes the preparation and characterization of a piezoelectric ceramic polymer composite that is based on the ceramic powder prepared in Example 1 and polyvinylidene fluoride. For instances in which the apparatus used for any measurements are not mentioned in this and the following examples, the instruments have been described in a previous example. The polyvinylidene fluoride was purchased from Polyscience, Inc. and had a molecular weight of 350,000 and a melting point of between 166° and 170° C. The ceramic powder (70 g) was classified into three equal weight portions according to particle size using an air-jet separation method. The first portion had a particle size distribution between 40 and 70 µm, the second between 70 and 90 µm, and the third between 90 and 150 µm. The above particle size distributions were determined by comparing each portion with 40±2 µm diameter glass beads under a microscope (Leica Zoom 2000). The error in the determination of particle size (i.e., particle diameter) is expected to be ±10 µm. For the purpose of ceramic powder dispersion in the polymer, PVDF (2.89 g) was dissolved in boiling acetone (50 mL) on a hot plate. After the second portion of ceramic (20.0 g) was placed in the solution of PVDF in acetone and stirred for 5 min, nitrogen was introduced to remove acetone until a wet gel-like soft paste was obtained. Small portions of this paste were pressed into wet pellets using an IR pellet press at a pressure of about 2000 psi. After drying under vacuum (25 inch mercury) at 100° C. for one hour, the pellets were hot-pressed at 200° C. for 15 minutes using a CARVER laboratory press. The final pellet has a diameter of about 1.4 cm and a thickness of about 2.0 mm. After poling at 120° C. and 125 kV/cm for 30 minutes using the poling setup of FIG. 1, the poled pellet was cleaned using hexane. An air-dry silver paste (GC Electronics) was used to electrode the pellet. The resulting applied electrodes have a diameter of about 8.7 mm. The hydrostatic voltage coefficient ($g_h$) of the electroded sample was measured using an air-calibrator. The air-calibrator consists of (1) an AC sweep generator (WAVETEK 164), (2) a cylindrically shaped air chamber with two speakers at two ends, (3) an ultra-low-noise voltage amplifier (ITHACO 144N), and (4) a spectrum analyzer (HP3585B). The AC sweep generator outputs a sinusoidal AC wave (75 Hz) to drive the two speakers to produce sound pressure waves in the air chamber. The acoustic sound pressure in the chamber was detected by either a test sample or a standard that is interfaced with the voltage amplifier. The output of the voltage amplifier was analyzed by the spectrum analyzer at 75 Hz. The free field hydrophone sensitivity ($S_r$) in dB (re 1 V/µPa) was calculated using $$S_r = S_s + 20 \log V_r - 20 \log V_s + 20 \log (C_r/(C_r + C_{cable})), \quad (4)$$

where $S_s$ is the sensitivity of a standard in dB (re 1 V/µpa), $V_r$ and $V_s$ are the voltages measures at 75 Hz using the spectrum analyzer for the sample and standard, respectively, $C_r$ is the capacitance of the sample, and $C_{cable}$ is the total capacitance of the wire connecting the sample to the amplifier, the input of the voltage amplifier, and unidentified sources. $C_{cable}$ was determined (using Equation 4) to be 59.8 pF for the current instrumentation setup. The $g_h$ value was calculated using Equation 2. Equation 4 assumes that the output impedance of the standard is much lower than the input impedance of the voltage amplifier. This is true for the present voltage amplifier because the standard has a capacitance larger than 1000 pF. The piezoelectric hydrostatic charge coefficient ($d_h$) was determined (using instrumentation at Pennsylvania State University) by applying an alternating hydrostatic pressure on a sample and a standard. The resultant charge that is collected on electroded surfaces is inputted into a charge amplifier to generate an output voltage that is further buffered with a voltage follower. An hydraulic oil bath was used as a sonic medium for transmission of acoustic pressure waves generated by an actuator at 50 Hz. A PZT standard is placed adjacent to the sample. Output voltages from the buffer were measured by a spectrum analyzer (HP 3585B) for both sample and standard, respectively. The hydrostatic piezoelectric charge coefficient was calculated using $$d_h = d_{hs} V_s A_s / (V_s A_s),\qquad(5)$$

where $V_s$ and $V_t$ are the voltages of the standard and sample that are measured using the spectrum analyzer, $A_t$ and $A_s$ are the electrode areas of the sample and standard, respectively, and $d_{hs}$ is the hydrostatic charge coefficient of the standard. The standard used is a PZT plate with a $d_h$ value of 26.4 pC/N. The hydraulic oil bath was pressurized to a hydrostatic pressure of about 100 psi. The measured dielectric and piezoelectric properties are listed in Tables 1 and 2. Note that a figure of merit $(g_h d_h)$ as high as $50(\pm 5) \times 10^{-13}$ m²/N has been achieved. The measured figure of merit obtained using our instrumentation (Table 1) is in good agreement with that we obtained using the instrumentation at Pennsylvania State University. Considering that $d_{33}$ nearly equals $d_h$ for Ca-PT if the poling field is high enough, the $d_{33}$ value measured by a Berlincourt $d_{33}$ meter is consistent with the $d_h$ determinations obtained using the above described alternate measurement methods. The dielectric loss of 0.020 for this composite is somewhat high. This is because of the silver paste used to make electrodes. As shown later, when these electrodes were placed by either gold-sputtered electrodes or those deposited using silver ink (Creative Materials), the dielectric loss decreased to as low as 0.013.

TABLE 1

Dielectric and Piezoelectric Properties Measured Using an Air-Calibrator

| $d_{33}$ (pC/N) @ 100 Hz | $g_h$ (mV/N) @ 75 Hz | $\epsilon_{33}$ᵃ @ 1 kHz | tan$\delta$ @ 1 kHz | $g_h^2 \epsilon_{33} \epsilon_0$ᵇ $(10^{-13}$ m²/N) |
|---|---|---|---|---|
| 58 | 0.094 | 70 | 0.020 | 54 |

(a) Dielectric constant relative to the dielectric constant of free space.
(b) $\epsilon_0$ is the permittivity of free space $(8.854 \times 10^{-12}$ F/m).

TABLE 2

Hydrostatic Charge Coefficient and Figure of Merit $(d_h^2/\epsilon_{33}\epsilon_0)$ Determined Using the Hydraulic Liquid Chamber Method

| $d_h$ (pC/N) @ 50 Hz | $\epsilon_{33}$ᵃ @ 1 kHz | $d_h^2/\epsilon_{33} \epsilon_0$ᵇ$(10^{-13}$ m²/N) |
|---|---|---|
| 56 | 70 | 51 |

ᵃDielectric constant relative to the dielectric constant of free space.
ᵇ$\epsilon_0$ is the permittivity of free space $(8.854 \times 10^{-12}$ F/m).

EXAMPLE 3

This example demonstrates that composites of this invention provide essentially pressure-independent performance. This measurement was obtained using the instrumentation of Example 2 for the determination of the hydrostatic piezoelectric charge coefficient. The hydrostatic pressure loading was achieved by using a high pressure oil pump to pressurize the hydraulic oil vessel in which the sample and standard were placed adjacent to each other. The pressurization started from atmosphere pressure to 170 psi, then increased to 550 psi, and further to 1100 psi. Finally, the pressure was decreased back to 120 psi. At each pressure, there was an at least 10 minutes stabilization period to ensure the reliability of the measurements. The results are summarized in Table 3.

TABLE 3

Effects of Hydrostatic Pressure Loading on the Piezoelectric Charge Coefficient

| Pressure (psi) | $d_h$ (pC/N) |
|---|---|
| 170ᵃ | 56 |
| 550 | 54 |
| 1100 | 53 |
| 120ᵇ | 54 |

ᵃInitial pressure
ᵇFinal pressure.

The Table 3 results show that the composite-material sensor shows a pressure-independent performance up to at least 1100 psi. After the sample was cleaned with hexane to remove silicon oil on the surface, the hydrophone figure of merit was remeasured using the air-calibrator described in example 2. The result show that the figure of merit was unchanged by the high pressure exposure.

EXAMPLE 4

This example shows that a ceramic/polymer composite of this invention provides a $d_{33}$ value which is higher than the product of the volume fraction of ceramic and the $d_{33}$ value of the pure ceramic. The Ca-PT ceramic powder (6.0 g) with a particle size of 140±10 µm and PVDF (0.87 g) were used to prepare composites according to the procedure outlined in Example 2. The final composite pellet had a diameter of 1.4 cm and a thickness of 2.1 ram. The pellet was poled for 15 minutes at 120° C. and 21 kV using the poling setup of FIG. 1. The poled pellet was cleaned with hexane and gold electrodes were sputter-deposited. For comparison with results obtained using the composite of the present invention, a Ca-PT green pellet was pressed using an IR pellet press and sintered according to the condition in Example 1. Gold electrodes were sputtered on, which were further backed with silver ink (Creative Material). The poling for the sintered pellet (that had a diameter of about 1.2 cm and a thickness of 0.75 mm) was carried out for 30 minutes at 120° C. and 8.5 kV using the setup in FIG. 1. The dielectric and piezoelectric properties measured one week after poling are summarized in Table 4 for the ceramic/polymer composite and for the pure ceramic. Our sintered polymer-free Ca-PT ceramic disk has properties close to expectations. Since the present composite contains 65% ceramic powder by volume, the product of this volume fraction and the $d_{33}$ value of pure ceramic Ca-PT disk is 55 pC/N. As shown in Table 4, the observed $d_{33}$ (64 pC/N) for the present polymer/ceramic composite is much higher than this value.

TABLE 4

| Dielectric and Piezoelectric Properties of the Composite and Ca-PT | | | |
|---|---|---|---|
| Properties | Composite | Ca-PT | EDO Specifications for Ca-PT |
| $d_{33}$ (pC/N @ 100 Hz) | 64 | 82 | 68ᵃ |
| $\epsilon$ @ 1 kHz | 80 | 270 | 270 |
| tan$\delta$ @ 1 kHz | 0.013 | 0.008 | 0.009 |

ᵃThe frequency utilized was not specified by EDO.

EXAMPLE 5

This example demonstrates the high temperature stability of the dielectric and piezoelectric properties of our composite sensors. One of the piezoelectric composite disks of Example 2 was poled under the condition specified in this example. Then the disk was placed in a temperature-controlled vacuum oven (Precision, GCA Corporation). The dielectric and piezoelectric properties were monitored as a function of time. The results are summarized in Table 5. Measurement details were covered in previous examples. The test began one week after poling. After two months at 100° C., the free-field hydrophone sensitivity decreased by only 0.5 dB, which is within experimental error. Hence, the Table 5 results indicate that the dielectric and piezoelectric properties of the present composite sensor are stable at 100° C. for at least two months.

TABLE 5

Thermal Stability Test of the Composite Sensor

| time | T (°C.) @ 100 Hz | $d_{33}$ (pC/N) @ 1 kHz | C (pF) @ 1 kHz | tanδ | S (dB re 1 V/μPa) |
|---|---|---|---|---|---|
| 0 h | 100 | 54 | 20.9 | 0.016 | −196.0 |
| 1 h | 100 | 56 | 21.7 | 0.017 | −196.0 |
| 2 h | 100 | 56 | 21.4 | 0.017 | −196.0 |
| 4.5 h | 100 | 55 | 21.6 | 0.016 | −196.0 |
| 7.5 h | 100 | 55 | 21.3 | 0.016 | −196.0 |
| 24 h | 100 | 54 | 21.1 | 0.018 | −195.7 |
| 10 days | 100 | 53 | 20.9 | 0.015 | −196.0 |
| 15 days | 100 | 52 | 21.1 | 0.015 | −196.4 |
| 60 days | 100 | 54 | 20.4 | 0.019 | −196.5 |

EXAMPLE 6

This example shows how the dielectric and piezoelectric properties of a composite of this invention depends on ceramic particle size. All samples used for this comparison had the same ceramic powder loading level of 65 volume percent. Different particle sizes were obtained for the Ca-PT powders by using an air-jet particle displacement method for separating according to particle size. Four differently sized ceramic powders were used to carry out the present experiment. They have average particle sizes of 50, 60, 120, and 140 (±10) μm, respectively. The procedures for the composite preparation and poling have been described in Example 2 and will not be repeated here. The measurement results obtained one week after poling are summarized in Table 6.

TABLE 6

Particle Size Effects on Dielectric and Piezoelectric Properties of Composites at a Ceramic Powder Loading Level of 65% by Volume.

| Particle Size (μm) | ε @ 1 kHz | tanδ @ 1 kHz | $d_{33}$ @ 100 Hz | thickness (mm) | $g_h d_h$ ($10^{-13}$ m²/N) | S (dB re 1 V/ μPa) |
|---|---|---|---|---|---|---|
| 50 | 70 | 0.015 | 52 | 1.95 | 46 | −195.5 |
| 60 | 70 | 0.018 | 51 | 2.05 | 48 | −194.7 |
| 120 | 75 | 0.018 | 55 | 2.02 | 50 | −195.1 |
| 140 | 80 | 0.013 | 64 | 2.00 | 48 | −195.4 |

Table 6 shows that at a ceramic powder loading level of 65 volume percent the ceramic particle size has only has a moderate influence on the dielectric constant and piezoelectric charge coefficient. The ceramic/polymer composites containing larger ceramic particles tend to give a slightly higher dielectric constant and piezoelectric charge coefficient. There are small effects on the dielectric loss, figure of merit, and free-field hydrophone sensitivity. Note that all of these composites offer very high free-field hydrophone sensitivities.

EXAMPLE 7

This example, which is for comparison with Example 6, shows how ceramic particle size influences the dielectric and piezoelectric properties of the composite of the present invention when the ceramic powder loading level is 50% by volume. In contrast with the results obtained for a particle loading level of 65% by volume, the present results for a particle loading level of 50% by volume demonstrate critically important enhancements of piezoelectric charge coefficient, figure of merit, and free field hydrophone sensitivity when particle size is increased. The composite preparation and poling procedures are the same as those in Example 2. The ceramic powders with average particle sizes of 50, 80, and 140 (±10 μm) were used in this example. The measurement results obtained one week after poling are summarized in Table 7. Similar to the case of the ceramic powder loading level of 65% by volume, the particle size has a small effect on the dielectric constant and no effect on the dielectric loss. However, the particle size has major influences on the piezoelectric charge coefficient, figure of merit, and free-field hydrophone sensitivity. The larger the ceramic particle, the better the above properties are. As can be seen, the figure of merit is more than doubled when the particle size is increased from 50 to 140 μm.

TABLE 7

Particle Size Effects on Dielectric and Piezoelectric Properties of Composites at a Ceramic Powder Loading Level of 50% by Volume

| Particle Size (μm) | ε @ 1 kHz | tanδ @ 1 kHz | $d_{33}$ @ 100 Hz | thickness (mm) | $g_h d_h$ ($10^{-13}$ m²/N) | S (dB re 1 V/ μPa) |
|---|---|---|---|---|---|---|
| 50 | 42 | 0.016 | 28 | 1.65 | 14 | −200.0 |
| 80 | 42 | 0.014 | 35 | 1.82 | 24 | −196.7 |
| 140 | 52 | 0.015 | 48 | 1.85 | 37 | −195.6 |

EXAMPLE 8

This example demonstrates the importance of a nearly uniform particle size distribution on the preparation of the polymer/ceramic composites of the present invention. The Ca-PT ceramic powder (3.5 g) and PVDF (0.32 g) were used to make a composite by the method described in Example 1. This composite contains about a 65 volume percentage of the ceramic powder. The composite disk with a diameter of 1.4 cm and a thickness of 0.74 mm was electroded with an air-dry silver paste (GC Electronic). The composite was DC-poled in a silicon oil bath at 125° C. and 10 kV (133 kV/cm) for 30 min using a spring-loaded poling setup. Then the sample was cooled to 80° C. with the bias-field on. After the poled disk was washed with hexane, the dielectric and piezoelectric properties were determined one week after poling using the methods described in previous examples. The observed properties are: $d_{33}$=53 pC/N, ε=100, $g_h$=0.046 mV/N, and $g_h d_h$=20×$10^{-13}$ m²/N. The figure of merit of this composite is about half that of the composite prepared from ceramic powders with a uniform or very narrow particle size distribution.

EXAMPLE 9

This example demonstrates the importance of using a low dielectric constant ceramic component for the fabrication of piezoelectric ceramic/polymer composites. Fifty grams of the green EDO EC-97 PZT powder, together with several rods prepared by compaction of this powder, was sintered in an alumina crucible using the following time-temperature schedule:

(1) from 25° C. to 600° C. at a heating rate of 5° C./min, (2) 12 hours at 600° C., (3) from 600° C. to 1200° C. at a heating rate of 5° C./min, (4) 3 hours at 1200° C., and (5) from 1200° C. to room temperature by uncontrolled cooling. At step 3 the alumina crucible was covered with an alumina cap. The resultant yellow-brown powder was shaken in a plastic bottle, so as to produce free-flowing behavior. The sintered ceramic rods were found after sintering to have a diameter of about 1.12 cm and a length of about 7.0 mm. One of the ceramic rods was electroded by depositing silver ink (from Creative Materials) on the two opposite ends and curing the ink at 100° C. for 5 hours. Poling was carried out using the poling setup shown in FIG. 1 by first placing the electroded rod in the silicon oil bath. The distance between the surface of silicon oil and the upper electrode was about 0.5 cm. The lower electrode is on a metal rod that sat on a metal pan that was used to contain the silicon oil. The needle that was used to generate the corona was 2 cm from the silicon oil surface. Poling was performed at 80° C. and 18 kV for 30 minutes. One week after poling, the measured properties are $d_{33}=610$ pC/N at 100 Hz, $\epsilon=3400$, and $\tan\delta=0.015$ at one kHz. For comparison, the EDO specifications are $d_{33}=583$ pC/N, $\epsilon=3450$, and $\tan\delta=0.02$ at one kHz. The powder particles of the sintered ED-76 ceramic were classified into three equal-weight portions according to the particle sizes using the air-jet separation method. The middle portion was used to prepare a composite containing a 65% volume fraction of the ceramic powder. Poling conditions are the same as used in Example 2. After poling, electrodes were attached using silver ink containing a catalyst that lowered the curing temperature. The curing was carried out at 70° for 3 hours. The measured $d_{33}$ value is between 50 and 65 pC/N for several different disks. This $d_{33}$ value is very low compared with that for the corresponding ceramic ($d_{33}=610$ pC/N). Thus, the dielectric constant of the piezoelectric ceramic is a very important factor to consider when designing ceramic/polymer composites.

EXAMPLE 10

This example describes the preparation of cylindrical hydrophones from our composite materials. A composite (6.0 g) consisting of 64 volume percent ceramic powder (containing particles having an average diameter of about 80 μm) and 36% PVDF by volume was prepared in the form of a 2.0 mm thick sheet according to the procedure outlined in Example 2. A cylinder with an inner diameter of 1.0 cm and an outer diameter of 1.42 cm was compression-molded at about 10,000 to 30,000 psi and 200°–210° C. The poling of these cylinders was performed for 1 hour at 130° C. using the maximum voltage that does not cause dielectric breakdown (about 25 kV). After electroding with silver ink (from Creative Materials), the dielectric and piezoelectric properties were measured three days after poling. The most completely poled cylinder shows the following properties: a capacitance of 89 pF, $\tan\delta=0.017$, $S=-194.5$ dB (re 1 V/μPa), $g_h=0.089$ mV/N, $\epsilon=60$, and $g_h d_h=42\times10^{-13}$ m²/N. As a test of reproducibility, more than twenty cylinder hydrophones were prepared. All of them give a free-field hydrophone sensitivity higher than −196 dB (re 1 V/μPa). In order to test sensor durability at high pressures, four of these cylinders were statically pressurized at 2000 psi for 12 hours in a high pressure vessel. The high pressure exposure did not change the sensor sensitivity measured in the air calibrator.

What is claimed is:

1. A piezoelectric composite comprising a mixture of piezoelectric ceramic particles in a polymeric material, which polymeric material is continuous in three dimensions, wherein (a) the weight-average diameter D of the piezoelectric ceramic particles ranges from 30 microns to 200 microns, (b) at least 50 weight percent of the piezoelectric ceramic particles have an average diameter that is in the range from 0.5 D to 1.5 D, (c) the dielectric constant of the piezoelectric ceramic particles at one kHz is less than about 700, (d) the dielectric constant of the polymeric material at one kHz is above 2.8, (e) the dielectric loss of the polymeric material at one kHz is less than 0.02, and (f) the volume fraction of the piezoelectric ceramic in the composite is from 40% to 74%.

2. The composite of claim 1 wherein the polymeric material has a dielectric constant of above 5 and a dielectric loss of less than 0.02 at one kHz.

3. The composite of claim 1 wherein ceramic particles have a dielectric loss of less than 0.01, a Curie transition temperature that is above 200° C. and wherein the volume percentage of ceramic particles in the mixture is from 50 to 60%.

4. The composite of claim 1 wherein the polymeric material comprises a polymer or copolymer having vinylidene fluoride monomer units, a polymer or copolymer having acrylonitrile monomer units, or mixtures thereof.

5. The composite of claim 1 wherein the polymeric material comprises a polymer selected from the group consisting of poly(oxymethylene), nylon 6, nylon 66, nylon 610, epoxies, polyurethanes, cellulose, and polymers derived from cellulose.

6. The composite of claim 1 wherein the ceramic particles comprise a substance selected from the group consisting of $M_tM'_{1-t}NbO_3$, wherein M and M' are selected from the group consisting of Na, Li, and K and t is less than unity; $Pb_xQ''_v(Ti_yQ_zQ'_u)O_3$, wherein Q and Q' are selected from the group consisting of Zn, Nb, Zr, Sb, and Mn, Q" is selected from the group consisting of Bi, La, and Nb, x+v is about 1, y+z+u is about 1, and v is no more than about 0.05; $Na_{0.5}Bi_{0.5}TiO_3$; and $Na_{0.75}Pb_{0.125}NbO_3$.

7. The composite of claim 1 in which the ceramic particles comprise a substance selected from the group consisting of $[Pb_{1-v}Ca_v][(Co_{1/2}W_{1/2})_wTi_{1-w}]O_3$, $[Pb_xSm_y](Ti_zMn_{1-z})O_3$, $PbNb_2O_6$, and mixtures thereof, wherein v is about 0.24, w is about 0.04, x is about 0.85, y is about 0.10 and z is about 0.98.

8. The composite of claim 2 wherein the weight-average diameter D of the particles of the piezoelectric ceramic is from 40 microns to 150 microns, wherein at least 80 weight percent of the particles of the ceramic have an average diameter that is in the range from 0.7 D to 1.3 D, and wherein the ratio of maximum particle diameter to minimum particle diameter is smaller than 1.3 for at least 50 weight percent of the ceramic particles.

9. The composite of claim 1 wherein said polymeric material has a dielectric constant of above 10 and a dielectric loss of less than 0.01 at one kHz and a melting point of above 150° C.

10. A shaped article comprising the composite of claim 1 wherein the thickness of the shaped article is greater than or equal to 1 mm.

11. A shaped article comprising the composite of claim 1 wherein the ceramic particles have a weight-average particle size that is less than one-tenth of the smallest linear dimension of the shaped article.

12. The composite of claim 1 which is poled, wherein the piezoelectric ceramic particles have a ratio of $-d_{33}$ to $(d_{31}+d_{32})$ that exceeds 5, wherein $d_{33}$ is the piezoelectric charge coefficient for stress applied in the poled direction, and $d_{31}$ and $d_{32}$ are the piezoelectric charge coefficients for stress applied in the directions orthogonal to the poled direction.

13. The composite of claim 12, wherein the piezoelectric ceramic has a ratio of $-d_{33}$ to $(d_{31}+d_{32})$ that exceeds 10 and wherein the dielectric constant of the ceramic is less than 200 at one kHz.

14. The composite of claim 1 that contains from 45 to 60 volume percent of ceramic particles, wherein the ceramic particles form a continuous network of mechanically touching particles in one, two, or three dimensions.

15. The composite of claim 14, wherein the ceramic particles form a continuous network of mechanically touching particles in three dimensions.

16. The composite of claim 1 having a pore volume of less than about 1.0 volume percent.

17. A process of making a composite comprising forming a mixture of piezoelectric ceramic particles in a polymeric material, which polymeric material is continuous in three dimensions, wherein (a) the weight-average diameter D of the piezoelectric ceramic particles ranges from 30 microns to 200 microns, (b) at least 50 weight percent of the piezoelectric ceramic particles have an average diameter that is in the range from 0.5 D to 1.5 D, (c) the dielectric constant of the piezoelectric ceramic particles at one kHz is less than about 500, (d) the dielectric constant of the polymeric material at one kHz is above 2.8, (e) the dielectric loss of the polymeric material at one kHz is less than 0.025, and (f) the volume fraction of the piezoelectric ceramic in the composite is from 40% to 74%, wherein said piezoelectric ceramic particles are in the form of a free-flowing sintered powder obtained by heating a free-flowing mixture of ceramic-forming metal oxide powders at a temperature of at least about 400° C. for a sufficient time that would sinter a compacted disk of said free-flowing mixture of ceramic-forming metal oxide powders, and wherein said mixture of piezoelectric ceramic powder and polymeric material is melt processed at a pressure of at least 5,000 psi to produce a shaped form.

18. The process of claim 17, wherein said piezoelectric particles are made by spray drying a calcinated mixture of oxides and wherein said piezoelectric particles comprise a substance selected from the group consisting of $M_sM'_{1-t}NbO_3$, wherein M and M' are selected from the group consisting of Na, Li, and K and t is less than unity; $Pb_xQ''_v(Ti_yQ_zQ'_u)O_3$, wherein Q and Q' are selected from the group consisting of Zn, Nb, Zr, Sb, and Mn, Q" is selected from the group consisting of Bi, La, and Nb, x+v is about 1, y+z+u is about 1, and v is no more than about 0.05; $Na_{0.5}Bi_{0.5}TiO_3$; and $Na_{0.75}Pb_{0.125}NbO_3$.

19. A process for the preparation of a shaped, piezoelectric composite article comprising (I) dispersing a free-flowing powder of piezoelectric ceramic particles into a solution of a solvent and a polymeric material, (II) forming a composite by steps comprising at least one of (i) and (ii):

(i) adding a non-solvent for the polymeric material to the solvent and separating formed solids from the mixture of said solvent and non-solvent; and (ii) evaporating the solvent from the solution to form a composite, and (III) pressing the composite into a shaped form at a temperature of above 200° C. and at a pressure of at least about 10,000 psi, wherein (a) the weight-average diameter D of the piezoelectric ceramic particles is from 30 microns to 200 microns, (b) at least about 50 weight percent of the piezoelectric ceramic particles have an average diameter that is in the range from 0.5 D to 1.5 D, (c) the dielectric constant of the piezoelectric ceramic at one kHz is less than 500, (d) the dielectric constant of the polymeric material at one kHz is above 2.8, (e) the dielectric loss of the polymeric material at one kHz is less than 0.025, and (f) the volume fraction of the piezoelectric ceramic in the composite is from 40% to 74%.

20. The process of claim 19 wherein the polymer comprises a material selected from the group consisting of a polymer or copolymer having vinylidene fluoride monomer units, a polymer or copolymer having acrylonitrile monomer units, or mixtures thereof and wherein the ceramic particles comprise a material selected from the group consisting of $[Pb_{1-v}Ca_v][(Co_{1/2}W_{1/2})_wTi_{1-w}]O_3$, $[Pb_xSm_y](Ti_zMn_{1-z})O_3$, $PbNb_2O_6$, and mixtures thereof, wherein v is about 0.24, w is about 0.04, x is about 0.85, y is about 0.10 and z is about 0.98.

21. A process of poling a composite article having edges, which composite article comprises a mixture of ceramic particles in a polymeric material, which process comprises placing the composite article in an electrical path between a corona discharge and ground so that the edges of said composite are shielded from the corona discharge by an insulating material positioned on the edge of the composite article, wherein a side of said composite article opposite to the corona discharge is contacted with a metallic conductor, the composite article is positioned in a heated bath containing a fluid, the field applied to the composite article from the corona discharge is above about 120 kV/cm, and the temperature of the bath is at least about 30° C. below the highest melting temperature of the polymeric material.

22. The process of claim 21 in which the composite article is placed in an electrical path between a corona discharge and ground so that the edges of the composite are shielded from the influence of the corona discharge by a cylindrical insulating material on an edge of the composite, wherein two opposite sides of said composite article are contacted with a metallic conductor, the composite article is positioned in a heated bath containing a fluid, the field applied to the composite article is above about 120 kV/cm, the temperature of the bath is at least about 30° C. below the highest melting temperature of the polymeric material, and the composite article is in the shape of a cylinder.

23. A pressure sensor comprising the composite of claim 1 that is in the shape of a plate or cylinder and at least two electrodes electrically connected to the composite.

24. A piezoelectric actuator comprising the composite of claim 1.

25. The piezoelectric actuator of claim 24 which is an acoustic projector.

26. A process for forming a composite comprising forming a mixture of piezoelectric ceramic particles in a monomer or prepolymer, followed by reaction of said monomer or prepolymer to produce a polymeric matrix material that is continuous in three dimensions, wherein (a) the weight-average diameter D of the piezoelectric ceramic particles ranges from 30 microns to 200 microns, (b) at least 50 weight percent of the piezoelectric ceramic particles have an average diameter that is in the range from 0.5 D to 1.5 D, (c) the dielectric constant of the piezoelectric ceramic particles at one kHz is less than about 700, (d) the dielectric constant of the polymeric material at one kHz is above 2.8, (e) the dielectric loss of the polymeric material at one kHz is less than 0.02, and (f) the volume fraction of the piezoelectric ceramic in the composite is from 40% to 74%.

27. The process of claim 26, wherein the said polymeric matrix material comprises an epoxy composition.

* * * * *